United States Patent
Rimler et al.

(10) Patent No.: US 10,212,851 B2
(45) Date of Patent: Feb. 19, 2019

(54) DATA CENTER AIR DUCT SYSTEM

(71) Applicant: SCHNEIDER ELECTRIC IT CORPORATION, West Kingston, RI (US)

(72) Inventors: Barry Rimler, Rockville, CT (US); Steven Brown, Boston, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 115 days.

(21) Appl. No.: 14/928,251

(22) Filed: Oct. 30, 2015

(65) Prior Publication Data

US 2017/0127569 A1    May 4, 2017

(51) Int. Cl.
*H05K 7/20* (2006.01)
*F16L 3/26* (2006.01)
*F24F 13/02* (2006.01)

(52) U.S. Cl.
CPC ............ *H05K 7/20709* (2013.01); *F16L 3/26* (2013.01); *F24F 13/0227* (2013.01); *F24F 13/0254* (2013.01); *H05K 7/20745* (2013.01)

(58) Field of Classification Search
CPC .... H05K 7/20709; F16L 3/26; F16L 13/0227; F16L 13/0254; F24F 13/0227; F24F 13/0254
USPC ........................................................ 454/184
See application file for complete search history.

(56) References Cited

U.S. PATENT DOCUMENTS

| | | | |
|---|---|---|---|
| 7,261,256 B2 | 8/2007 | Pattie et al. | |
| 7,944,692 B2 | 5/2011 | Grantham et al. | |
| 8,031,468 B2 | 10/2011 | Bean, Jr. et al. | |
| 8,180,495 B1* | 5/2012 | Roy | H05K 7/20745 165/67 |
| 8,184,435 B2 | 5/2012 | Bean, Jr. et al. | |
| 8,193,448 B2 | 6/2012 | Syed | |
| 8,934,242 B2 | 1/2015 | Bean, Jr. et al. | |
| 2005/0211847 A1* | 9/2005 | Pattie | F16L 3/233 244/129.1 |

(Continued)

FOREIGN PATENT DOCUMENTS

| | | |
|---|---|---|
| CN | 102461358 A | 5/2012 |
| EP | 2216575 A1 | 8/2010 |

OTHER PUBLICATIONS

Avelar, Victor, "How Overhead Cabling Saves Energy in Data Centers", White Paper 159, 2011 Schneider Electric—Data Center Science Center, pp. 1-8.

(Continued)

*Primary Examiner* — Steven B McAllister
*Assistant Examiner* — Allen Schult
(74) *Attorney, Agent, or Firm* — Lando & Anastasi, LLP

(57) ABSTRACT

An air duct system is configured to be used with an air containment system that spans an aisle defined by rows of racks. The air duct system includes a plurality of ceiling panels supported by the air containment system, and a plurality of support curbs mounted on the ceiling panels. The plurality of support curbs is configured to support ductwork positioned on the support curbs, ductwork positioned on the plurality of support curbs. The air duct system further includes a plurality of panels secured to the support curbs to create a plenum underneath the ductwork. A kit providing an air duct system is further disclosed.

15 Claims, 11 Drawing Sheets

(56) References Cited

U.S. PATENT DOCUMENTS

2005/0284988 A1    12/2005  Lawver
2010/0144265 A1*  6/2010  Bednarcik .......... H05K 7/20745
                                                            454/184
2010/0300650 A1*  12/2010  Bean, Jr. ............ H05K 7/20345
                                                            165/67
2016/0265690 A1*  9/2016  Sorkin .................. F16M 11/00

OTHER PUBLICATIONS

Chatsworth Products, "Frame Supported Hot Aisle Containment (HAC) Solution", Oct. 10, 2014, Rev.5 10/14 MKT-60020-558, pp. 1-6.

Emerson Network Power, "SmartAisle™ Containment—Energy-efficient Data Center Cooling", Feb. 17, 2014, Emerson Electric Co.—pp. 1-32.

Minkels—Solution to Rely on—Varicondition® Cooling Solutions, "Free Standing Cold Corridor®—The ultra-modular, cost efficient aisle containment solution", A Group brand/legrand, Nov. 3, 2014, pp. 1-3.

Polargy—We Keep the Cloud Cool™, "Six Fundamental Data Center Containment Topologies", May 29, 2014, pp. 1-8.

Extended European Search Report from corresponding European Application No. 16196103.2 dated Mar. 16, 2017.

\* cited by examiner

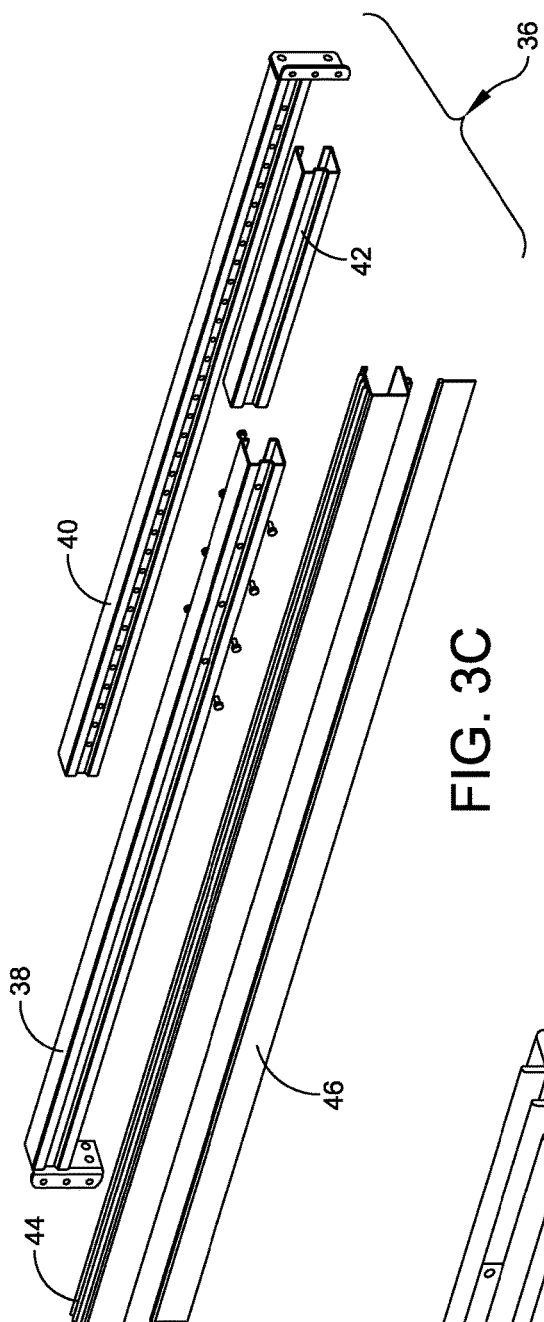
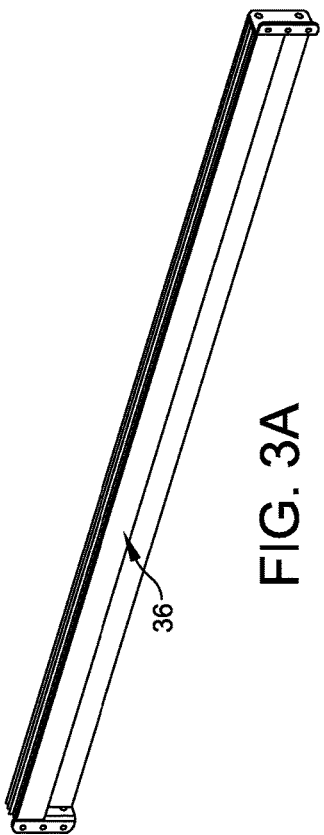
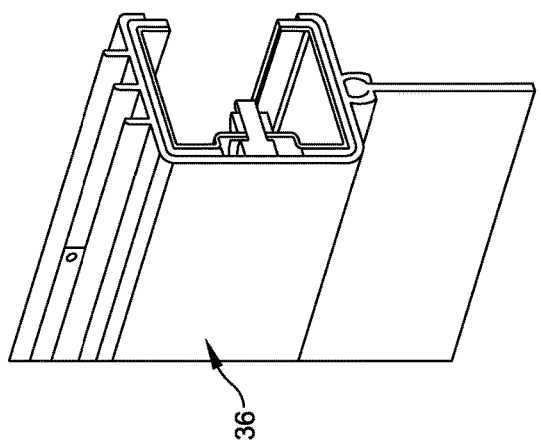
FIG. 3C
FIG. 3A
FIG. 3B

DATA CENTER AIR DUCT SYSTEM

BACKGROUND OF THE INVENTION

1. Field of the Invention

The present disclosure relates to racks and enclosures, and more particularly to a data center air containment system that provides an integrated solution for supporting piping, ductwork, raceways and cable trays containing wires, cables, and other means of conveyance of electricity, thermal energy, data and other transferrable media.

2. Discussion of Related Art

To control the flow of air throughout a data center, and to optimize the airflow through equipment racks provided in the data center, it may be desirable to contain the air in hot and cold aisles to conserve energy and to lower cooling cost by managing airflow. As a result, hot aisle containment systems have been developed to contain and manage air within the hot aisle. Cold air containment systems have been developed as well.

The prevailing structures and methods for air containment within data centers are limited to containment structures that are self-supporting or supported by other data center equipment, e.g., equipment racks. These containment structures have limited or no provisions for supporting the weight of other related and necessary data center pipes, ducts, wiring and hardware. The prevailing methods of installing such equipment include hanging the equipment from overhead structures associated with data center, placing the equipment on top of IT racks and equipment cabinets, or running the equipment under an accessible floor, separate from the structural floor of the building.

It is known that IT equipment maintained in a data center or other dedicated computing environment will almost always require additional dedicated cooling to supplement typical building comfort cooling to maintain an appropriate inlet air temperature for computing equipment. Over the years, data center cooling technologies and methodologies have taken many forms, and have evolved as the way data centers are designed, deployed, and maintained has also changed.

Historically, one data center cooling method has been under-floor cooling, in which large computer room air conditioners (CRACs) or computer room air handlers (CRAHs) stand on the perimeter of the room and force cooled air under the raised floor and into a plenum, as the tiles are supported a distance of twelve to thirty-six inches off of a foundation or floor of the room. Perforated tiles strategically placed in front of the equipment racks holding the IT equipment allow this air to escape the plenum and flood the area in front of the equipment rack with appropriately cooled temperature. The return air, now heated from the IT equipment, eventually makes it back to the CRAC unit and the cycle begins again. This method was not rigidly tied to a particular IT deployment methodology, as the perforated tiles could be substituted in front of any rack.

One advancement in data center thermal management was in close-coupled cooling (otherwise known as "in-row cooling"), in which the CRACs and CRAHs were no longer placed along a perimeter of the room, but were positioned directly against the IT equipment hosted in racks, typically arranged in an in-row fashion. This cooling methodology required a more rigid deployment of IT equipment, in that the close-coupled cooling was most effective in hot aisle and cold aisle arrangements.

Aisle containment is now part of a common IT deployment and cooling strategy, in which the aforementioned hot and cold aisles might be physically contained to prevent mixing of hot return air and cold supply air. Mixing hot air with cold air causes the data center cooling system to run less efficiently. The cooling methodologies have changed little, though. Currently, supplying air to or returning air from a contained aisle uses fully decoupled systems in which the ductwork that moves the air is suspended from the building infrastructure itself and the containment system is largely blind to the conveyance of air through the ductwork.

In addition, cable trays are used to create a pathway and to provide protection to wires installed between termination points, and are an alternative to electrical conduits. Cable trays can generally include an assembly or weldment used to support electrical wiring used for power distribution and communications. Traditional cable trays may include solid bottoms, or constructed in a style of a metal basket. Other cable trays include a "ladder" tray in which the cables are supported by bars that look like the rungs of a ladder. Other embodiments of cable trays may include solid or ventilated covers that offer protection to the cables from the types of hazards deemed most probable during installation, and during the service life of the cables placed within the tray.

SUMMARY OF THE INVENTION

One aspect of the disclosure is directed to an air duct system configured to be used with an air containment system that spans an aisle defined by rows of racks. In one embodiment, the air duct system comprises a plurality of ceiling panels supported by the air containment system, a plurality of support curbs mounted on the ceiling panels, the plurality of support curbs being configured to support ductwork positioned on the support curbs, ductwork positioned on the plurality of support curbs, and a plurality of panels secured to the support curbs to create a plenum underneath the ductwork.

Embodiments of the air duct system further may include the plenum enabling the ductwork to selectively deliver cool air to the aisle or exhaust hot air from the aisle. Each ceiling panel may be rectangular in construction and configured to extend across a top of a frame structure of the air containment system. Each ceiling panel may include a series of openings to enable air to flow between the plenum and the aisle. Each support curb may be a curved structure and is positioned to straddle two adjacent ceiling panels. Each support curb may include a support surface that is curved to receive a profile of ductwork supported by the support curbs. The plurality of support curbs may include a first series of support curbs positioned on the ceiling panels along one side of the ceiling panels and a second series of support curbs positioned on the ceiling panels along an opposite side of the ceiling panels. The first and second series of support curbs may be configured to complement one another to create a cradle that receives the ductwork. The plurality of panels may include blanking panels secured to the plurality of ceiling panels and the plurality of support curbs. The blanking panels may be configured to enclose sides of the plenum. The plurality of panels further may include end caps secured to the ceiling panels and the support curbs. The end caps may be configured to enclose ends of the plenum.

Another aspect of the disclosure is directed to a method of installing an air duct system comprising: securing ceiling panels on top of a frame structure of an air containment system; securing support curbs on the ceiling panels; securing panels to the support curbs; and positioning ductwork on the support curbs. The ceiling panels, panels and ductwork create a plenum, which enables the ductwork to selectively deliver cool air to the aisle or exhaust hot air from the aisle.

Embodiments of the method further may include securing a first series of support curbs to the ceiling panels along one side of the ceiling panels and securing a second series of support curbs to the ceiling panels along an opposite side of the ceiling panels. The two series of support curbs may be configured to complement one another to create a cradle that receives the ductwork.

A further aspect of the disclosure is directed to a method of selectively delivering or exhausting air from an aisle defined by an air containment system. In one embodiment, the method comprising one of the following: for cold aisle containment, delivering cold air into ductwork from a source of cold air, delivering the cold air to a plenum defined by ceiling panels, ductwork, and panels disposed between the ductwork and the ceiling panels, and passing the cold air into the aisle through diffusers provided in the ceiling panels; and for hot aisle containment, passing warm air from IT equipment in the aisle through diffusers provided in ceiling panels, containing the warm air in the plenum, and exhausting the warm air in the ductwork back to the source of cooling.

Another aspect of the disclosure is directed to a kit for an air duct system configured to be used with an air containment system that spans an aisle defined by rows of racks. In one embodiment, the kit comprises a plurality of ceiling panel supported by the air containment system, a plurality of support curbs mounted on the ceiling panels, the plurality of support curbs being configured to support ductwork positioned on the support curbs, and a plurality of panels secured to the support curbs to create a plenum underneath the ductwork when ductwork is positioned on the support curbs. The plenum enables the ductwork to selectively deliver cool air to the aisle or exhaust hot air from the aisle.

Embodiments of the kit further include configuring each ceiling panel to be rectangular in construction and configured to extend across a top of a frame structure of the air containment system. Each support curb may be a curved structure and is positioned to straddle two adjacent ceiling panels. Each support curb may include a support surface that is curved to receive the profile of ductwork supported by the support curbs. A series of support curbs may be positioned on the ceiling panels along one side of the ceiling panels and another series of support curbs positioned on the ceiling panels along an opposite side of the ceiling panels. The two series of support curbs may be configured to complement one another to create a cradle that receives the ductwork. The plurality of panels may include blanking panels secured to the ceiling panels and the support curbs, the blanking panels being configured to enclose sides of the plenum. The plurality of panels further may include end caps secured to the ceiling panels and the support curbs. The end caps may be configured to enclose ends of the plenum.

Yet another aspect of the present disclosure is directed to an air containment system configured to span an aisle defined by rows of racks. In one embodiment, the air containment system comprises a frame structure including two end frames provided at respective ends of the air containment system, and at least two horizontal beams, one for each side of the air containment system, releasably secured to the end frames. The frame structure is adjustable to achieve a desired height, length and width as required for a particular application of the air containment system.

Embodiments of the air containment system further may include a cantilever assembly releasably secured to vertical posts of the end frames at a desired elevation along lengths of the posts. The cantilever assembly may be configured to support various types of equipment. The cantilever assembly may include two arms releasably secured to the vertical posts of the end frames, and at least one cross member releasably secured to the arms so that the at least one cross member extends between the arms. The cantilever assembly may be configured to support a network cabinet. Each end frame may include two vertical posts and at least one cross member releasably secured to the posts at a desired elevation along lengths of the posts. Each end of the at least one cross member may include a connector configured to be releasably secured to one of the two vertical posts and to vary a length of the cross member. Each horizontal beam may be releasably secured to the posts at a desired elevation along lengths of the posts. Each horizontal beam can be extended and retracted to achieve a desired length. Each horizontal beam may include an outer beam, an inner beam, and fasteners to connect the outer beam to the inner beam. Each horizontal beam further may include a spacer attached to the inner beam when connecting the outer beam to the inner beam. Each horizontal beam further may include a track that is secured to the outer beam and a brush strip that is secured to the track. The air containment system further may comprise at least one access window. The air containment system further may comprise a door frame assembly provided at one end of the air containment system. The door frame assembly may comprise two vertical supports and a horizontal support. The door fame assembly may be configured to support one or more doors that provide access to the aisle. The air containment system further may comprise several blanking panels releasably secured to the frame structure to enclose the aisle.

Another aspect of the disclosure is directed to a kit for an air containment system configured to span an aisle defined by rows of racks. In one embodiment, the kit comprises a frame structure including two end frames configured to be provided at respective ends of the air containment system, and at least two horizontal beams, one for each side of the air containment system, configured to be releasably secured to the end frames. The kit further comprises a cantilever assembly configured to be releasably secured to the end frames at a desired elevation along lengths of the end frames, the cantilever assembly further being configured to support various types of equipment.

Embodiments of the kit further may include access windows, blanking panels, and door frame assemblies. The kit further may comprise an air duct system configured to be supported by the frame structure. Each end frame may include includes two vertical posts and at least one cross member configured to be releasably secured to the posts at a desired elevation along lengths of the posts. Each horizontal beam may be configured to be releasably secured to the posts at a desired elevation along lengths of the posts. Each horizontal beam may be configured to be extended and retracted to achieve a desired length.

Another aspect of the disclosure is directed to a cable tray configured to organize wires and cables used associated with the air containment system and the equipment racks deployed within the air containment system. In one embodiment, the cable tray comprises a bottom wall, a first side wall secured along one edge of the bottom wall, and a second side wall secured along an opposite edge of the bottom wall. One of the first side wall and the second side wall is perforated to enable a box to be mounted on the side wall.

Embodiments of the cable tray further may include an optional cover to enclose and protect the contents supported by the cable tray and an optional end cap to enclose an end of the cable tray. The bottom wall and the other of the first side wall and the second side wall may be fabricated from solid or perforated sheet metal, plastic or composite material, or a combination of these materials. The cable tray may be designed to be used with a cantilever assembly, or other suitable structures, and includes guides and supports for cables and wires, while changing elevations. The bottom wall includes at least one curved end to accommodate elevation changes. At least one of the first side wall and the second side wall may include openings formed therein at intervals along a length of the side wall to allow cables run through a central channel of the cable tray defined between the two side walls. The first side wall and the second side wall may be each configured to receive a side cover plate, which is constructed from solid or perforated sheet metal, plastic or composite material onto which common trade size junction boxes or receptacle boxes can be mounted.

The present disclosure will be more fully understood after a review of the following figures, detailed description and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which:

FIG. 3A is a perspective view of a horizontal beam constructed as a variable length component, compatible with the frame structure of the air containment system;

FIG. 3B is a perspective sectional view of the horizontal beam;

FIG. 3C is an exploded perspective view of the horizontal beam;

DETAILED DESCRIPTION OF THE PREFERRED EMBODIMENTS

Figure 1:
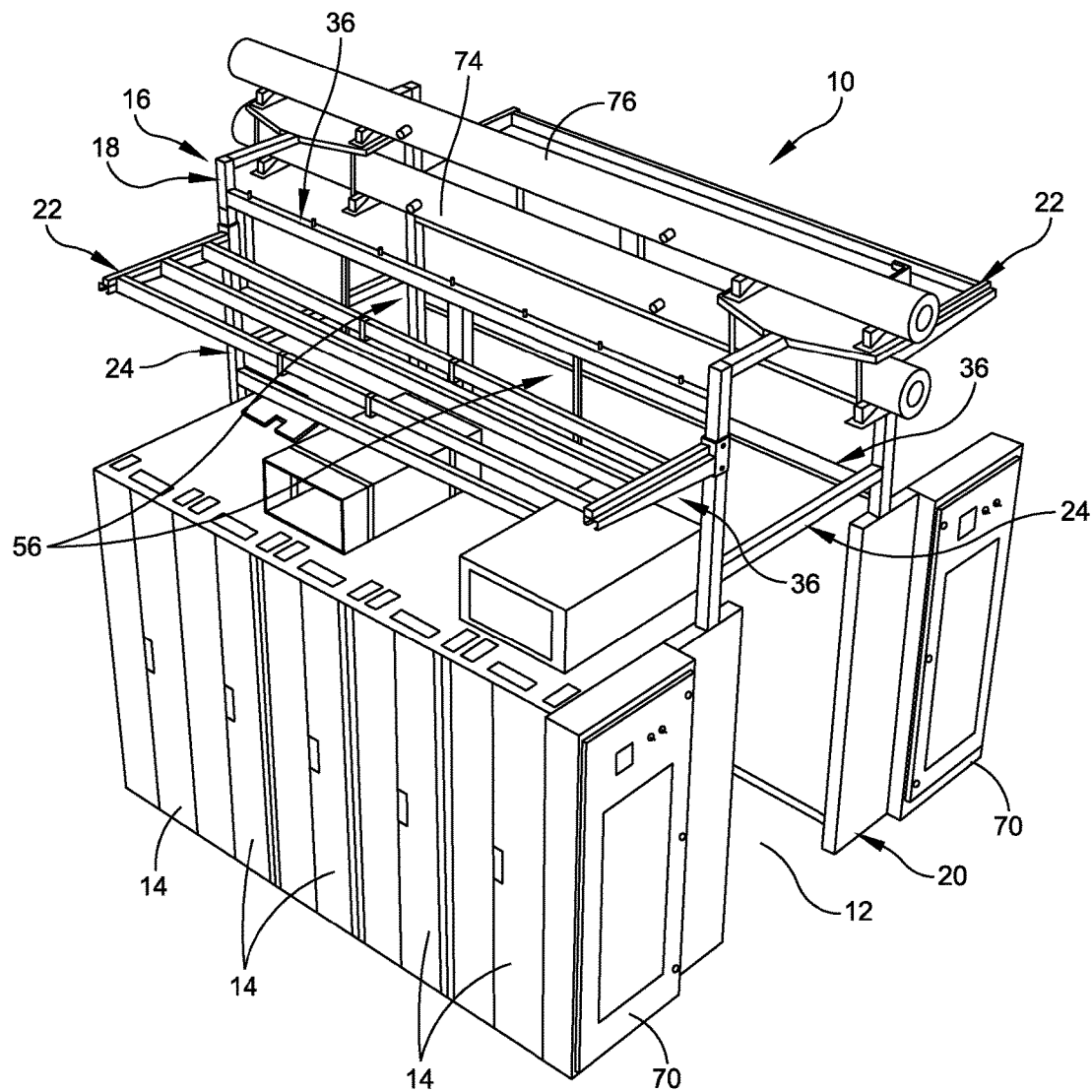
FIG. 1 is a perspective view of a data center air containment system of an embodiment of the present disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks, which are designed to house electronic equipment including but not limited to data processing, networking and telecommunications equipment. Each equipment rack may be configured to include a frame or housing adapted to support the electronic equipment. The housing includes a front, a back, opposite sides, a bottom and a top. The front of each equipment rack may include a front door so as to enable access into the interior of the equipment rack. The sides of the equipment rack may include one or more panels to enclose the interior region of the rack. The back of the equipment rack may also include one or more panels or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack.

As discussed above, data centers may be configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks in which the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

To address the heat build-up and hot spots within the data center or equipment room, and to address climate control issues within the data center or room in general, a cooling system may be provided. In one configuration, the cooling system may be provided as part of the data center infrastructure. In another configuration, the data center's cooling system may be supplemented with the CRAC and/or CRAH units described above. With yet another configuration, a modular cooling system may be provided in which modular cooling racks are interspersed within the rows of equipment racks.

In one embodiment, a management system may be provided to monitor and display conditions of the equipment racks, including the cooling racks. The management system may operate independently to control the operation of the equipment and cooling racks, and may be configured to communicate with a higher level network manager or with a management system associated with the data center. In certain circumstances, it may be desirable control the airflow within the hot and cold aisles, and in the hot aisles in particular. Typically, heat generated from electronic components housed within the equipment racks is exhausted out of the backs of the equipment racks into the hot aisles. It may be desirable to contain the hot air for conditioning by a cooling unit, such as the modular cooling unit described above.

At least some embodiments of the present disclosure are directed to a data center air containment system including a frame structure that is easy to assemble and provides a single, integrated unit that encloses the aisle while facilitating the conveyance of cooling, electrical, and communication/networking equipment. In one embodiment, the air containment system includes a frame structure having end frames and cross frames that can be easily assembled without the use of tools. The air containment system further includes cantilevered arms that support equipment, including cable trays specifically designed to support cables. The air containment system further includes an air duct support that is integrated with roof or ceiling panels.

Referring now to the drawings, and more particularly to FIG. 1, a portion of a data center, generally indicated at 10, is illustrated. In particular, an aisle 12 is located between two rows of equipment racks. FIG. 1 illustrates a single row of equipment racks, each indicated at 14. As shown, the row of equipment racks 14 is positioned so that the fronts of the equipment racks face outwardly. Similarly, a second row of equipment racks (not shown for clarity) may be positioned on an opposite side of the aisle 12 so that the fronts of the equipment racks face outwardly and the backs of the equipment racks face the backs of the row of equipment racks 14. By way of example only, the row of equipment racks 14 includes five equipment racks; however, the rows of equipment racks can include any number of equipment racks. In certain embodiments, one or more equipment racks 14 may be replaced by a cooling rack to provide cooling to the aisle 12.

In one embodiment, the rows of equipment racks 14 can be arranged so that hot air is exhausted through the backs of the equipment racks into the aisle 12. Conversely, the rows of equipment racks 14 can be arranged so that cold air is deposited into the aisle 12 through one or more air duct systems. As shown in FIG. 1, air is capable of escaping from the aisle 12 above the equipment racks 14. As is well known, warm air rises, thus creating a situation in which the ceiling of the data center 10 may become too warm. This situation may negatively affect the climate control within the data center 10. An air containment system of an embodiment of the present disclosure is designed to control the flow of warm air within the data center 10, and within the space between the equipment racks 14. The air containment system is further configured to efficiently accommodate cooling, electrical and communication/networking equipment.

The portion of the data center 10 shown in FIG. 1 includes an air containment system, generally indicated at 16, of an embodiment of the present disclosure. As shown, the air containment system 16 includes a frame structure 18, a door frame assembly 20, and two cantilever assemblies, each indicated at 22. The frame structure 18 may consist of a weldment or assembly consisting of separate weldments, fasteners, extrusions (of plastic, aluminum and other materials) designed to support the weight, moments, and geometry of the components of the air containment system, including panels, doors, closures, ceiling panels, and other accessories providing air containment within the aisle 12. The frame structure 18 further is configured to support the various means of conveyance, the media within the means of conveyance, and data center equipment and accessories inclusive of batteries, specialized enclosures, electronic equipment, fire suppression equipment, lighting fixtures, and other data center equipment, within the frame structure.

Embodiments of the air containment system 16 enable equipment racks 14 and other floor standing, rolling or otherwise transportable equipment to be rolled, inserted, or otherwise moved and removed into and out of the frame structure of the air containment system, without being encumbered by piping, ductwork, raceways containing wires, cables, and other means of conveyance of electricity, thermal energy, data, and other transferable media, which shall be supported by the frame structure. In certain embodiments, the air containment system 16 can include means of conveyance that are specific to data center architecture, include electrical conduits, fire suppression pipes, chilled water pipes, "supply" and/or "return" air ducts and other similar guides, channels, or raceways, are intended to attached to the frame structure instead of the overhead structure of the building. For example, the frame structure 18 may be modified to support chilled water pipes. One embodiment of the disclosure, which will be discussed in greater detail below, is directed to an air duct that is supported by the air containment system 16.

As shown in FIG. 1, the frame structure 18 includes two end frames, each indicated at 24, which may be a welded end frame or an assembled end frame. The end frames 24 are provided at respective ends of the air containment system. Referring additionally to FIGS. 2A-2D, each end frame 24 includes two vertical posts 26, 28 and two cross members 30, 32. In certain embodiments the posts 26, 28 and the cross members 30, 32 may be roll-formed or extruded shapes that collectively create a strong vertical structure.

Figure 2A:
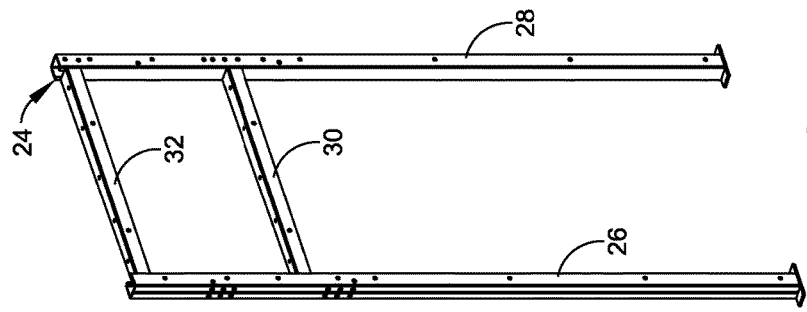
FIG. 2A is a perspective view of a welded end frame of a frame structure of the air containment system.
Figure 2B:
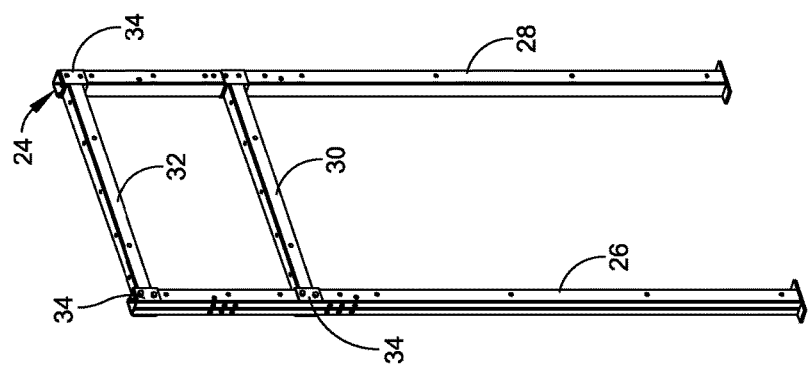
FIG. 2B is perspective view of an assembled end frame of a frame structure of the air containment system.
Figure 2C:
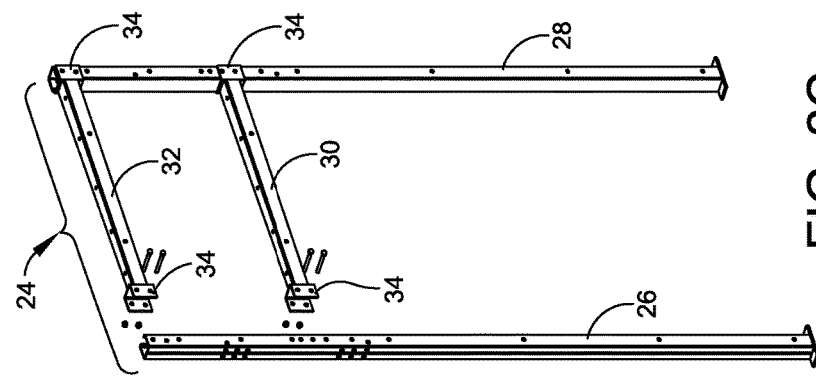
FIG. 2C is a perspective view of the assembled end frame in a partially assembled state.
Figure 2D:
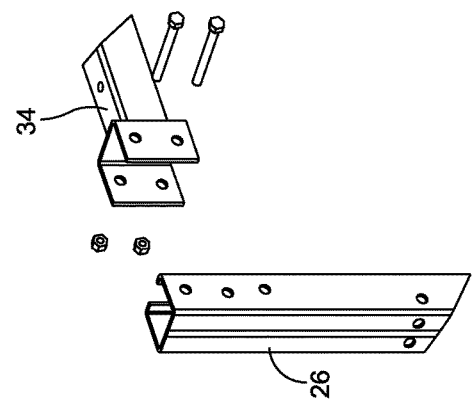
FIG. 2D is a perspective view of components of the assembled end frame.

As shown in FIG. 2A, in one embodiment, the posts 26, 28 and the cross members 30, 32 are welded to one another. As shown in FIGS. 2B-2D, in another embodiment, the cross members 30, 32 of the assembled end frame 24 may include connectors 34 that are designed to be releasably secured by mechanical fasteners, such as machine screws and nuts. In one embodiment, the connectors 34 may be secured to the cross members 30, 32 in such a manner as to vary lengths of the cross members to change a width of the end frame 24.

The cross members 30, 32 and the connectors 34 may be provided with a series of openings that correspond to one another to vary the length of the cross members when attaching the connectors to the cross members.

As shown, each vertical post 26, 28 may include a series of openings that enable the cross member 30 to be releasably secured to the posts at a desired elevation along lengths of the posts. Fasteners may be used to secure the cross members 30, 32 to the posts 26, 28. The assembled embodiment of the end frame 24 enables the end frame to be shipped and stored in a compact configuration. The posts 26, 28 of the end frame 24 may include feet that enable the end frame to stand vertically when positioned in an upright position. The arrangement is such that the end frame 24 can be assembled using simple tools with a minimum number of personnel.

Referring additionally to FIGS. 3A-3C, the frame structure further includes several horizontal beams, e.g., four, each generally indicated at 36. The horizontal beams 36 are attached to the end frames 24 either integrally or as mountable sub-assemblies of either fixed or variable length. The number and frequency of placement of the horizontal beams 36 is related to the heights of the end frames 24 and the requirements of the accessory sub-assemblies to be applied to the air containment system 16. In one embodiment, the horizontal beam 36 may be a fixed-length member. In another embodiment, which is illustrated in FIGS. 3A-3C, the horizontal beam 36 may be a variable-length member. When employing a variable-length beam, the horizontal beam 36 includes an outer beam 38, an inner beam 40, and fasteners, which are used to connect the outer beam to the inner beam. A spacer 42 may be provided, and attached to the inner beam 40 when the inner beam is attached to the outer beam 38. The horizontal beam 36 further includes a window and brush track 44 that is secured to the outer beam 38 and a brush strip 46 that is secured to the track. The brush strip 46 is positioned to engage IT equipment racks, e.g., equipment racks 14, that are rolled into the frame structure 18 to assist in containing air within the aisle 12. The brush strip 46 is provided to seal or otherwise contain air within the air containment system 16 when fully assembled with the equipment racks 14.

Figure 4:
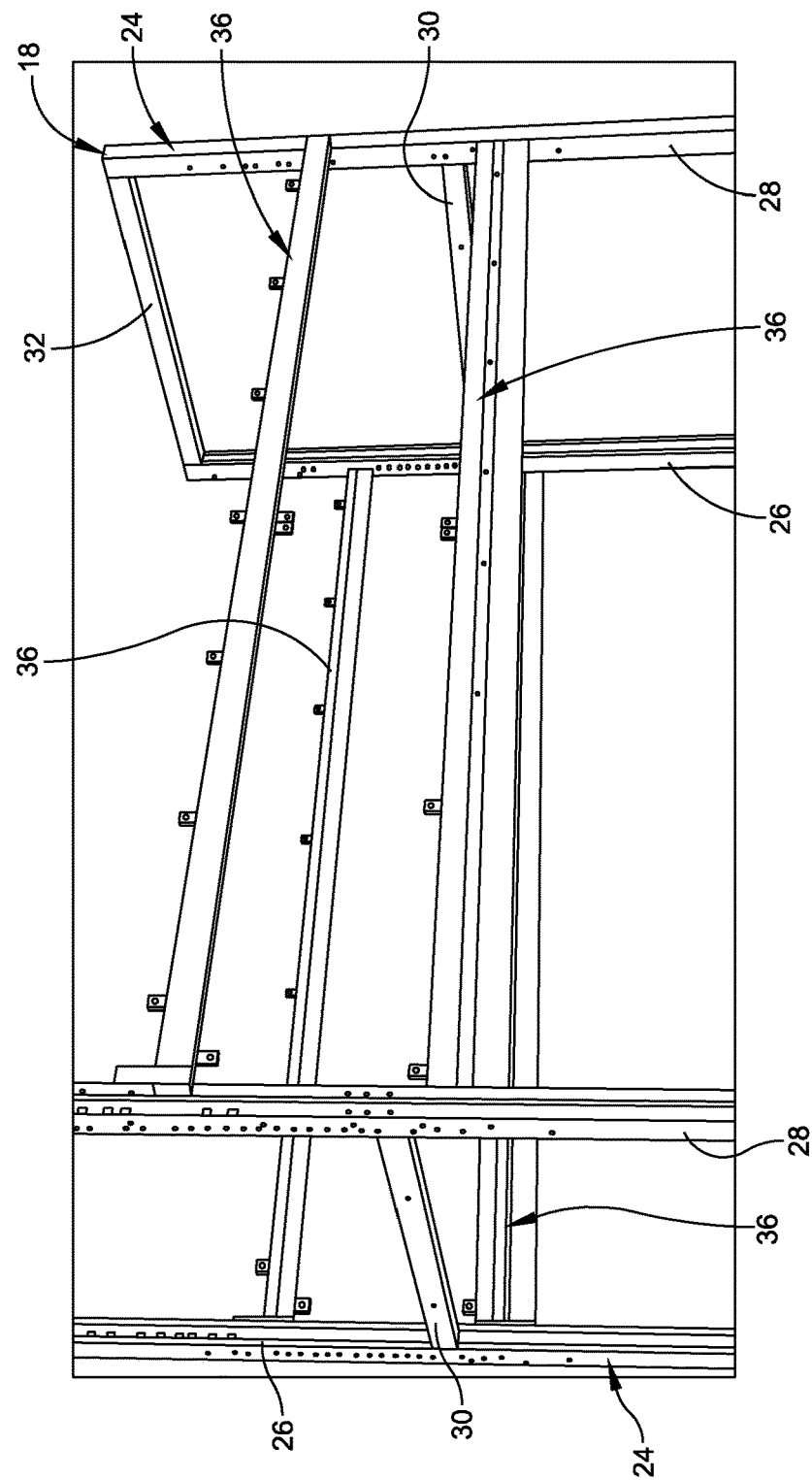
FIG. 4 is a perspective view of the frame structure in a partially assembled state.

FIG. 4 illustrates the horizontal beams 36 attached to the end frames 24. As shown, the vertical posts 26, 28 of the end frames 24 each include a series of openings that enables the horizontal beams 36 to be releasably secured to the posts at a desired elevation thereby enabling an effective height of the frame structure to be varied. With the provision of the adjustable cross members 30, 32 of the end frames 24 and the adjustable horizontal beams 36, the frame structure 24 is configurable to achieve a desired height, length and width as required for the particular application of the air containment system 16. The end frames 24 and the horizontal beams 36 can be assembled with use of minimal tools and personnel. Suitable fasteners can be used to releasably secure the horizontal beams 36 to the vertical posts 26, 28 of the end frames 24.

Figure 5:
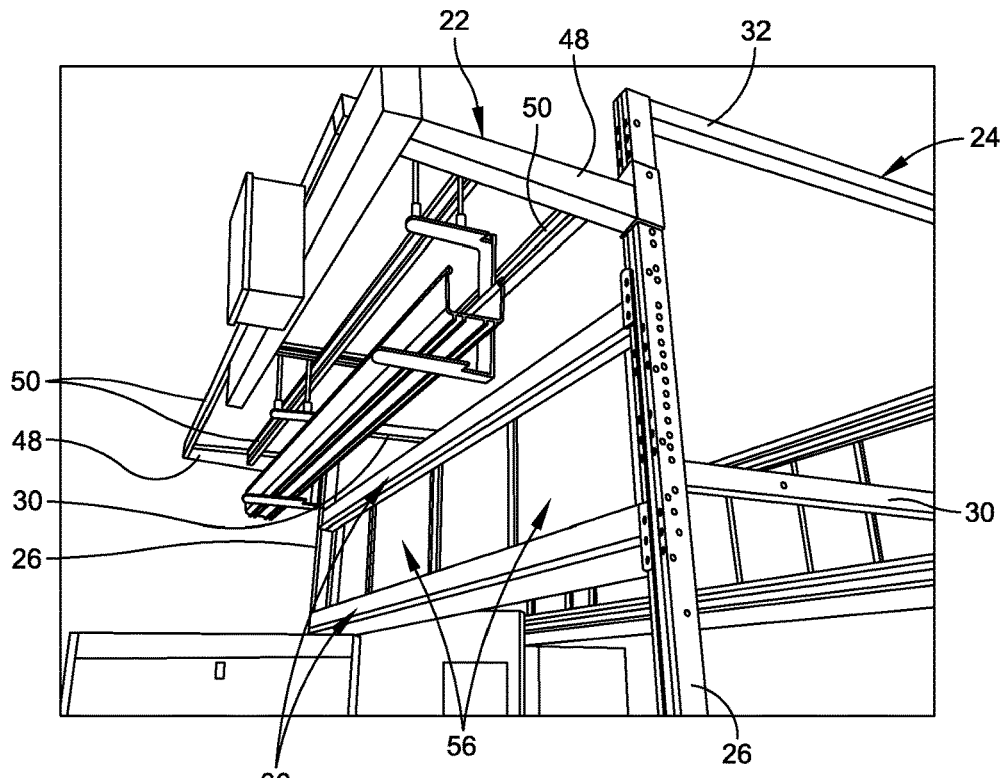
FIG. 5 is a perspective view of a cantilever assembly mounted on the frame structure.

Referring to FIG. 5, the cantilever assembly 22 is shown being releasably secured to the vertical posts 26, 30 of the end frames 24 of the frame structure 18. The cantilever assembly 22 is configured to support various types of equipment, such as electrical busways, electrical power distribution units, fiber optic trays, network cable trays, and other means of conveyance. As shown, in one embodiment, the cantilever assembly 22 includes two arms, each indicated at 48, and several cross members, each indicated at 50. The arms 48 are configured to be releasably secured to the vertical posts 26, 28 of the end frames 24 by fasteners at a desired elevation along lengths of the vertical posts. The cross members 50 are secured to the arms 48 by fasteners as well. FIG. 5 illustrates the cantilever assembly 22 supporting an electrical busway and a fiber optic tray. Other objects can be supported by the cantilever assembly 22 as well.

Figure 6:
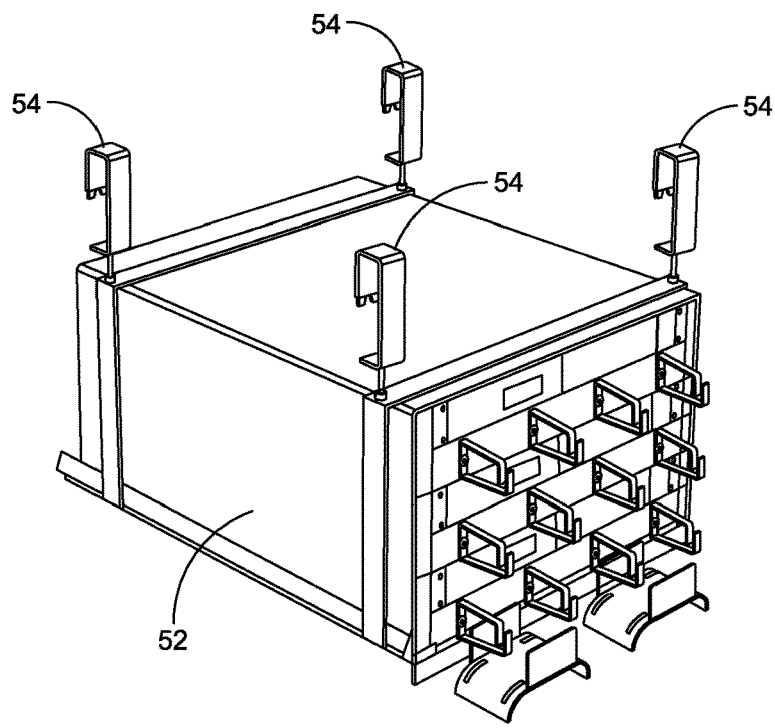
FIG. 6 is a perspective view of a network cabinet that is configured to be supported by the cantilever assembly.

For example, referring to FIG. 6, the cantilever assembly 22 may be configured to support communication equipment, such as a network cabinet 52. In some embodiments, network cabinets 52 are designed to be hung below the cantilever assembly 22 and may be installed to accommodate network equipment that might be inconvenient to locate within the IT racks or IT cabinets. The network cabinet 52, which is suspended from the cantilever assembly 22 and fully decoupled from the IT equipment racks 14 that are positioned below the cantilever assembly, allows a solution in which the entire data center network can be pre-populated and configured before compute and storage enters the data center 10. In one embodiment, the network cabinet 52 includes four hooks, each indicated at 54, which are configured to be hung on the cross members 50 of the cantilever assembly 22. FIG. 6 illustrates the network cabinet 52 that may be used for the installation of network switches or other space compatible accessories.

Figure 7:
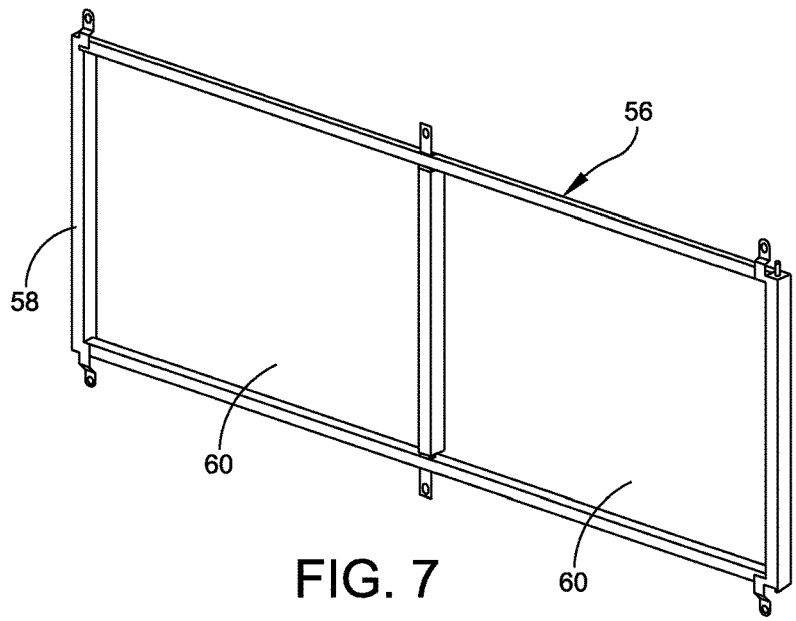
FIG. 7 is a perspective view of an access window of the air containment system.

Referring additionally to FIG. 7, the air containment system 16 further includes several access windows, each generally indicated at 56 in FIGS. 1 and 5, which enables access to the tops of the equipment racks 14 rolled into the frame structure 18. As shown, the access window 56 includes a rectangular frame 58 and can be configured with two separate window panes, each indicated at 60, which are designed to slide relative to one another to allow ingress and egress through the access window. Access windows 56 provide a means to perform assembly, maintenance, and operations to equipment adjacent to the contained aisle without the necessity to reach over installed racks. During aisle containment, each access window 56 is normally positioned in a closed position. As shown in FIGS. 1 and 5, two access windows 56 are shown assembled on the frame structure 18, with each access window in a closed position.

Figure 8:
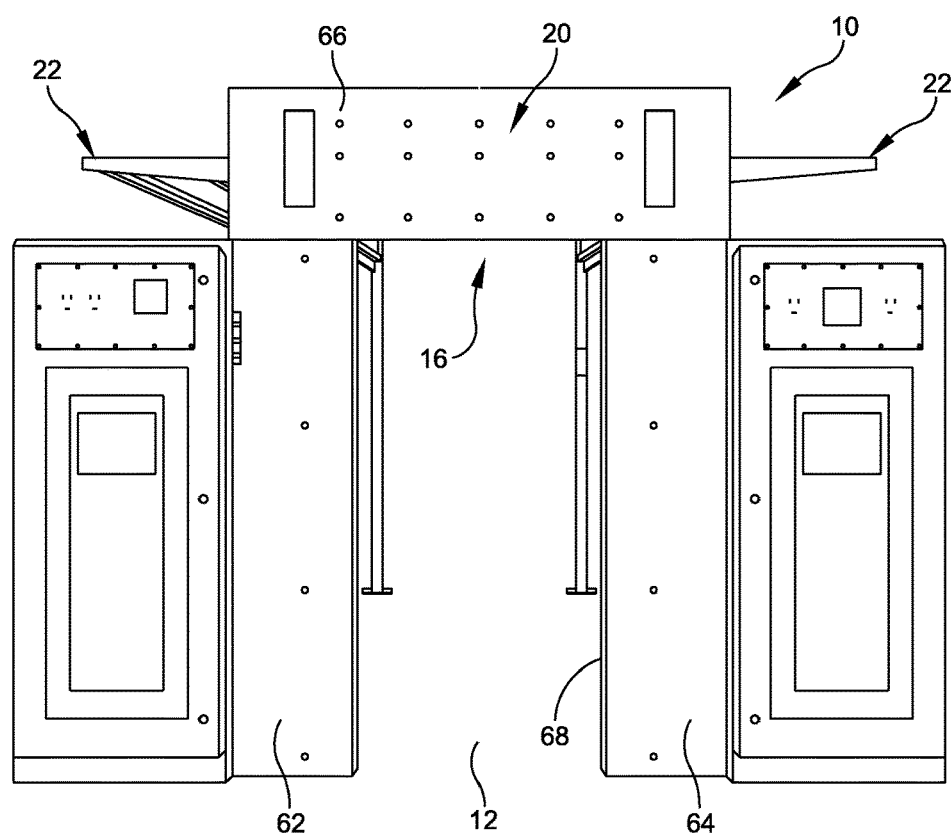
FIG. 8 is an elevational view of a door frame assembly of the air containment system.

Referring to FIG. 8, as mentioned above, the air containment system further includes at least one door frame assembly 20 provided at one end of the assembly. FIG. 8 illustrates one door frame assembly 20; however, it should be understood that an opposite end of the aisle 12 may be provided with another door frame assembly. The door frame assembly 20 includes two vertical supports 62, 64 and a horizontal support 66. The door fame assembly 20 is configured to support one or more doors that provide access to the aisle 12. In certain embodiments, a single door may be hinged to one of the vertical supports 62, 64 of door frame assembly 20 or may occupy a door frame opening 68 by way of overlapping sheets of flexible material, such as strip doors. In other embodiments, the doors may be bi-fold doors, which are installed in pairs on the vertical supports 62, 64. In other embodiments, the doors may slide horizontally either supported from above on tracks provided on the horizontal support 66 or on floor tracks, or a combination of both. Alternatively, the door may be configured as an overhead door. The door frame assembly 20 is configured with multiple mounting locations for optional doors.

Figure 9:
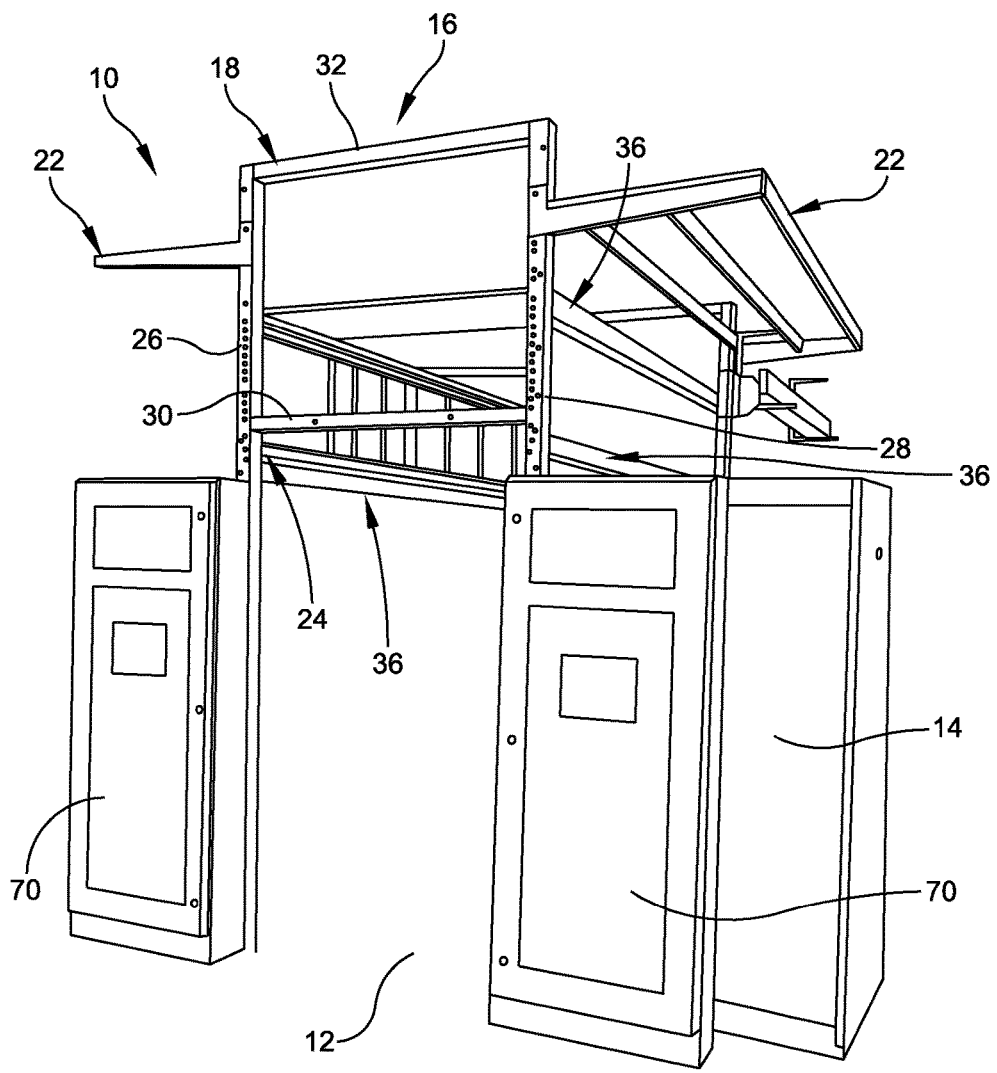
FIG. 9 is a perspective view of transition cabinets of the air containment system.

Referring to FIG. 9, in certain embodiments, the air containment system 16 further can include two transition cabinets, each indicated at 70, provided adjacent respective vertical posts 26, 28 of the end frame 24 and the vertical supports of the door frame assembly, although the door frame assembly is not shown in this drawing figure. Each transition cabinet 70 is a box-like structure configured to support important electrical and mechanical activation, control and distribution equipment. For example, each transition cabinet 70 can be configured to support electrical panel boards, automatic transfer switch ("ATS") controllers, electronic displays to display information and parameter adjustments, a human machine interface ("HMI"), control switches and actuators, access control equipment, fire detection and fire suppression equipment, and other electrical, electronic, pneumatic or similar accessories. FIG. 9 illustrates each transition cabinet 70 having electrical panel boards installed, with the control sections awaiting installation of controls.

Figure 10:
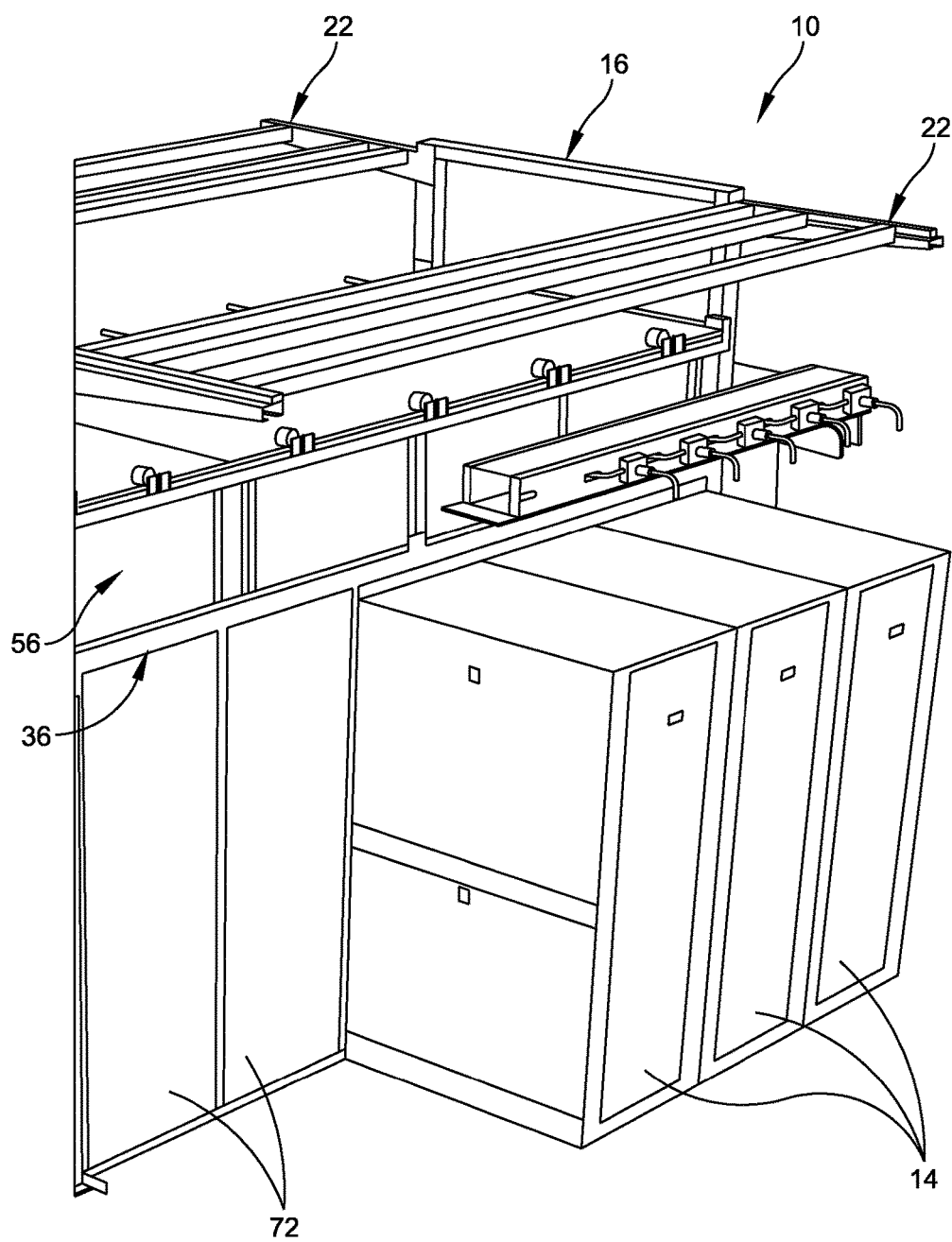
FIG. 10 is a perspective view of the air containment system having blanking panels to enclose an aisle.

Referring to FIG. 10, the air containment system 16 further may include several blanking panels, each indicated at 72, releasably secured to the frame structure 18 (e.g., vertical posts 26, 28 of the end frames 24 and to the horizontal beams 36 of the frame structure) to enclose the aisle 12. As shown, each blanking panel 72 can be fabricated from clear, translucent or transparent material in frames that mount to the frame structure 18 in locations where equipment racks 14 are not present to maintain the intended thermal characteristic separation of the contained aisle. The blanking panels 72 alternatively may be fabricated from opaque material. The blanking panels 72 may be sized based on the dimensions of the rack space intended to be "blanked" or be a variable size component able to be expanded or reduced to suit. Blanking panels 72 may incorporate integral lighting, pressure, or temperature sensing devices that add to the visual appearance or functionality of the blanking panels.

In certain embodiments, the blanking panels 72 can be accompanied and secured in place with unique hardware that sets the insertion depth of the adjacent racks in the row of equipment racks 14, secures the blanking panel at the top, and adjusts the blanking panel to a true vertical orientation with horizontal adjusters. Each blanking panel 72 can be configured, through a lower stop rail, to provide a vertical surface to meet the inserted equipment racks 14 that may be sealed, and a horizontal surface that may accept a sealing membrane to the floor. In this configuration, each blanking panel 72 can provide a greater degree of air containment within the frame structure 18 of the air containment system 16 than was previously obtained.

Embodiments of the air containment system 16 further include providing the system as a kit to be assembled and installed by the end user. Such a kit can be configured to include a frame structure 18 that has two end frames 24 in disassembled form and two or more (e.g., four) adjustable horizontal beams 36. The kit further can be configured to include one or more cantilever assemblies 22, each having two arms 48 and several cross members 50. The kit further can be configured to include several access windows 56, several blanking panels 72, and one or two door frame assemblies 20. As will be discussed in greater detail below, the kit further can be configured to include an air duct system, which is supported by the frame structure 18 of the air containment system 16. The kit can include additional components and accessories, such as fasteners and connectors.

Other embodiments of the air containment system 16 may include ceiling assemblies having roof or ceiling panels to contain air within the aisle 12. The ceiling assemblies may be configured to selectively allow a sprinkler system to spray water or some other fire retarding substance into the aisle 12. The ceiling assemblies also may be configured with light transmitting materials including glass, plastic, and other similar materials. In other embodiments, as discussed herein the frame structure 18 of the air containment system 16 enables the air containment system to have a greater or a lesser height, for installation in buildings of differing ceiling heights. As discussed herein, the end frames 24 and the horizontal beams 36 of the frame structure can be designed to have a greater or a lesser length, for installation in data halls of unpredictable length, and cross aisle spacing. The frame structure 18 and the various accessories (e.g., the cantilever assemblies 22, the access windows 56, and the blanking panels 72) of the air containment system 16 can be assembled without the use of tools or with a minimal use of tools by a minimum number of personnel. In one embodiment, the component parts of the air containment structure 18 can be fabricated, almost entirely, of low-cost, steel parts.

It should be understood that the air containment system 16 of embodiments of the present disclosure can be used for hot aisle containment or for cold aisle containment. The air containment system 16 provides a free-standing support structure on which a variety of equipment can be implemented. For example, the air containment system 16 can be used with overhead air conditioners (mounted overhead on the air containment system), with floor mounted air conditioners (placed within the air containment system), with ducted air conditioners (remote air conditioners connected to the air containment system by ducts), and/or with air delivered from under an access floor. For example, FIG. 1 illustrates two air ducts 74, 76 mounted on top of the frame structure 18 of the air containment system 16.

The air containment system 16 is designed to simplify the design of new data center buildings, to eliminate or at least reduce a reliance on the structure of a building to support the means of conveyance described above, to eliminate or at least reduce a need to use data center equipment (e.g., equipment racks 14) to support the means of conveyance, to enable a reuse of structures that may not be originally designed for data center use, and/or to save a data center business, time and money in building or outfitting a data center. The air containment system 16 can be assembled with a minimal number of tools, by a minimum number of personnel.

Figure 11:
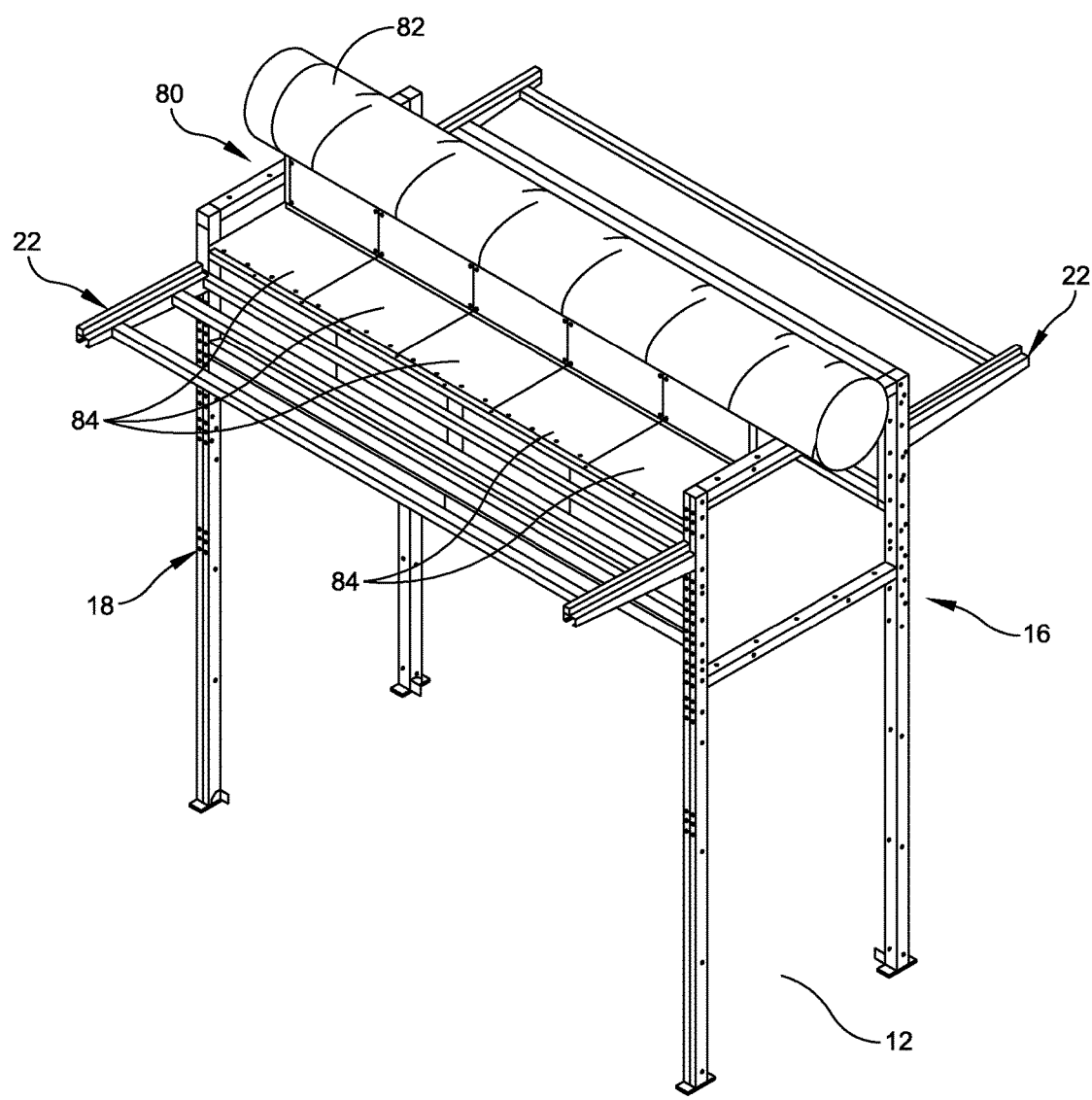
FIG. 11 is a perspective view of the frame structure supporting an air duct system of an embodiment of the present disclosure.

Referring to FIG. 11, the air containment system 16 can be further configured with an air duct system, generally indicated at 80, which is specifically designed to support an air duct 82, sometimes referred to as "ductwork," to create a fully integrated airflow system that contains the air and distributes the air. The air duct system 80 is modular in construction, which enables a single person or minimal personnel to install the components of the air duct system with ease. In one embodiment, the components of the air duct system 80 create a plenum, which allows the ductwork 82 to be decoupled to selectively deliver cool air to the aisle 12 or exhaust hot air from the aisle. The air duct system 80 is scalable in that the components of the air duct system can be added to the frame structure 18 of the air containment system 16 depending on the size of the frame structure. In certain embodiments, all major components of the air duct system 80 can be made from rolled form steel of varying gauges. The air ducts 82 can be a spiral ductwork that is commonly available through normal supply chains.

As shown in FIG. 11, the air duct system 80 includes several basic components that are assembled together to make up the system. In the shown embodiment, the air duct system 80 includes several ceiling panels, each indicated at 84, which, in one embodiment, is a rectangular sheet metal panel that extends across a top of the frame structure 18 of the air containment system 16 and is secured to the frame structure by plungers and fasteners. For example, each ceiling panel 84 may include a plunger that extends out from a peripheral edge of the panel, with the plunger being received within an opening formed in the frame structure 18 once the ceiling panel is properly placed on the frame structure. As shown in FIG. 11, there are five ceiling panels 84 that extend from one side of the frame structure 18 to an opposite side of the frame structure across the aisle 12. However, any number of ceiling panels 84 can be provided for a given system, with each ceiling panel being mounted to the frame structure 18 individually. As will be discussed below, each ceiling panel 84 can be fabricated with a series of slots or openings, together referred to as a "diffuser" or "diffusers," which are cut into the panel to enable air to flow from and to the aisle 12.

Figure 12:
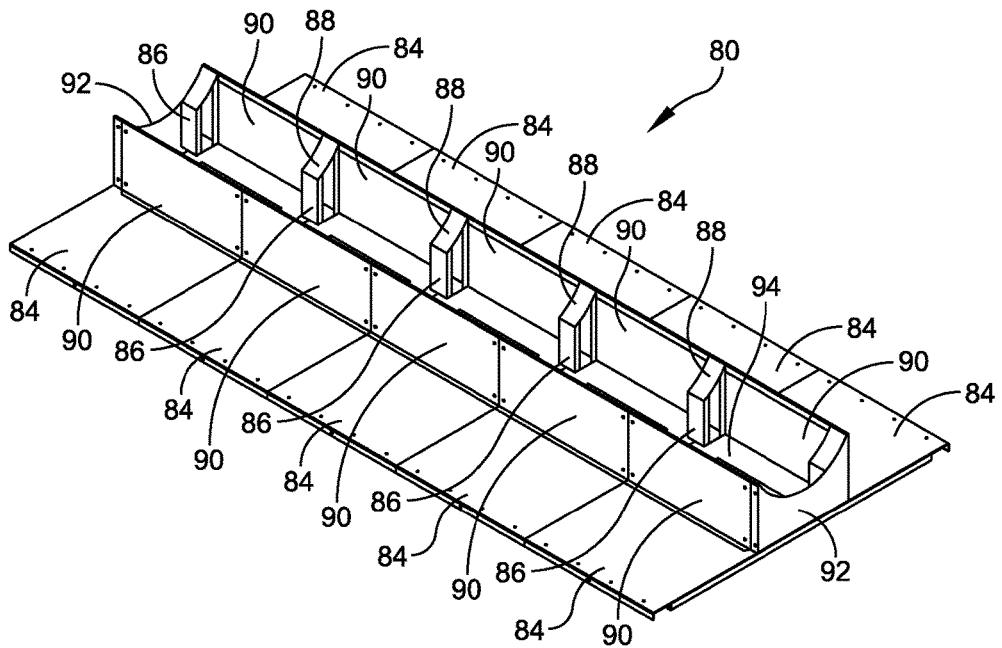
FIG. 12 is a perspective view of the air duct system with an air duct removed.

Referring additionally to FIG. 12, which shows the air duct system 80 with the ductwork 82 removed, the air duct system further includes several support curbs, each indicated at 86, which are mounted on the ceiling panels 84 to support ductwork positioned on the support curbs. As shown, in one embodiment, each support curb 86 is a curved sheet metal structure that straddles two adjacent ceiling panels 84 to land immediately above reinforcing ribs on the edge of each panel. Each support curb 86 includes a support surface 88 that is curved to receive the profile of ductwork supported by the support curbs.

As shown, a series of support curbs 86 are positioned on the ceiling panels 84 along one side of the air duct system 80. There is another series of support curbs 86 positioned on the ceiling panels 84 along an opposite side of the frame structure 18. The series of support curbs 86 are configured to complement one another to create a cradle that receives the ductwork 82. The support curbs 86 at the end of the ceiling panels 84 do not straddle over the edge but are placed entirely on the surface of the ceiling panel, flush with the edge of the ceiling panel. The support curbs 86 are sized and shaped to support ductwork 82 appropriately sized for the particular application. In some embodiments, the support curbs 86 are similarly constructed with respect to one another regardless where the support curb is positioned on the ceiling panel 84. In one embodiment, the support curbs 86 are fabricated from sheet metal and can be secured to the ceiling panels by welding or by fasteners.

The air duct system 80 further includes several blanking panels, each indicated at 90, which are designed to capture air underneath the ductwork 82 when fully assembled. FIG. 12 illustrates two blanking panels 90 for each ceiling panel 84. As shown, the blanking panels 90 are secured to the support curbs 86 by fasteners. In one embodiment, the blanking panels 90 can be fabricated from sheet metal as well. The arrangement is such that the blanking panels 90 seal the open space between support curbs 86, preventing air leakage when ductwork 82 is positioned on the support surface 88 of the support curbs 86. However, unlike the support curbs 86, the blanking panels 90 are position-sensitive, as the shorter blanking panels should be used between the support curbs closest to the end.

The air duct system 80 further includes end caps, each indicated at 92, which are provided at the ends of the blanking panels 90 to complete the seal of a plenum 94 defined by the ceiling panels 84, the blanking panels, the end caps and the ductwork 82 when the ductwork is in place on the support curbs 86. In one embodiment, each end cap 92 is a sheet metal panel that is bent to fit over the support curbs 86 at each end, and secured to the support curbs by fasteners to effectively seal off the plenum 94 when the ductwork 82 is in place. The end cap 92 has a cutout portion that matches the profile of the ductwork 82 when supported by the support curbs 86.

Figure 13:
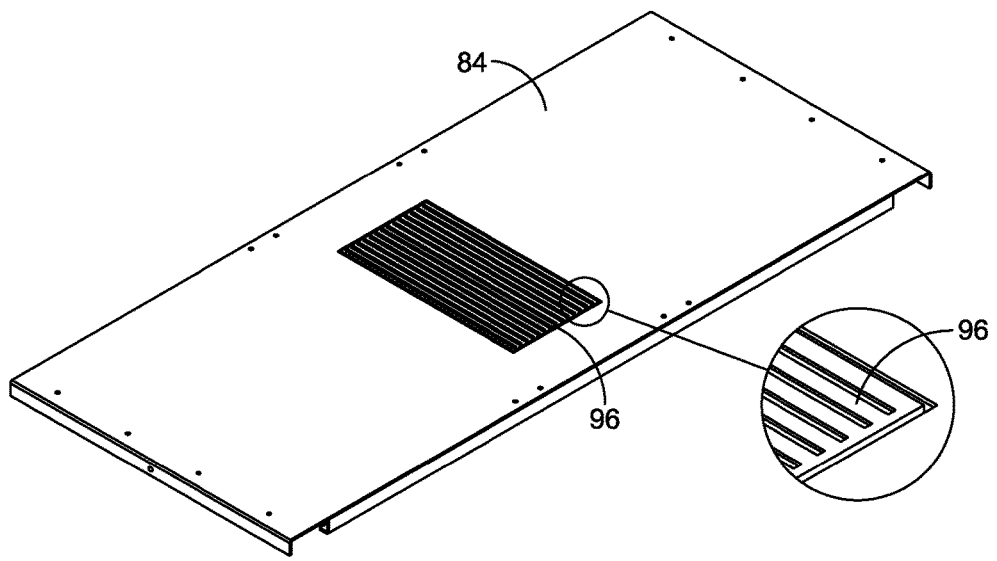
FIG. 13 is a perspective view of a ceiling panel of the air duct system.

Referring to FIG. 13, to achieve airflow between the air ducts 82 and the aisle 12, each ceiling panel 84 includes a series of slots or openings 96 formed in the ceiling panel, which create a diffuser for each ceiling panel. The ductwork 82 can have similar openings formed therein that create airflow between the ductwork and the aisle 12. The sizes and the shapes of the openings 96 in the ceiling panels 84 can be modified depending on the airflow requirements between the air ducts 82 and the aisle 12.

In a certain embodiment, as discussed herein, the components of the air duct system 80 are fabricated from sheet metal, and are intended to function with a purpose-built air containment system, such as air containment system 16. The air duct system 80 is easily scalable with the base unit being a single ceiling panel 84 as shown in FIG. 13. In one embodiment, the air duct system 80 can be provided unassembled, and can be installed with standard tools by a minimum number of personnel. Along with the air containment system 16, the air duct system 80 is intended to function as an air containment solution providing air management to the aisles of equipment racks 14.

During installation, the ceiling panels 84 are each lowered onto the top of the purpose-built frame structure 18 of the air containment system 16. The ceiling panels 84 can be constructed to include plungers on each end of the ceiling panel to secure the panel to the frame structure 18, the frame structure having openings to receive the plungers therein. As adjacent ceiling panels 84 are installed, the support curbs 86 are bolted (or welded) into place on the ceiling panels with fasteners. When all the ceiling panels 84 and the support curbs 86 are installed, the blanking panels 90 are fastened to the support curbs with fasteners. The end caps 92 are then secured on each end of the air duct system 80 to the support curbs 86 with fasteners. Once fully assembled to achieve the configuration shown in FIG. 11, the ductwork 82, with the appropriate cut-out allowing airflow into the plenum 94, is rolled over either side of the blanking panels 90 and rests in place in the cradle formed by the rounded support curbs 86.

During operation, for cold aisle containment, cold air enters the ductwork 82 from a CRAC or CRAH. The cold air floods the plenum 94 (i.e., the air-tight region formed by the ceiling panels 84, the blanking panels 90, the end caps 92 and the ductwork 82) and passes through the diffusers 96 formed in the ceiling panels, which are sized based on anticipated cooling load, and enters the cold-aisle, providing cool supply air to the IT equipment housed within the equipment racks 14. For hot aisle containment, the warm air from the IT equipment housed by the equipment racks 14, contained in the "hot aisle," passes through the diffusers 96 in the ceiling panels 84, and enters the plenum 94 (again, i.e., the air-tight region formed by the ceiling panels, the blanking panels 90, the end caps 92 and the ductwork 82). From there, the air enters the ductwork 82 supported by the support curbs 86 and moves through the ductwork back to the CRAC or CRAH for cooling.

In certain embodiments, the ceiling panels 84 can be provided with integrated diffuser adjusters so that the diffusers 96 can be made less or more open depending on cooling supply in the field.

Thus, it should be observed that the air duct system 80 and the air containment system 16 together eliminates or at least reduces the complexity and difficulty of installing ductwork that is suspended from the ceiling of the building. The air duct system 80 and the air containment system 16 further simplifies the distribution of supply air evenly into an aisle 12, and eliminates the rigidity of existing ductwork installs, in the sense that a size of the plenum 94 can be adjusted by a simple combination of the blanking panels 90 and support curbs 86.

The air duct system 80 and the air containment system 16 are designed to closely couple three systems of aisle containment, air distribution, and ductwork support, thereby simplifying the cooling of IT equipment supported by the equipment racks 14. In certain embodiments, the air duct system 80 can be assembled and erected using a minimum number of personnel. The air duct system 80 employs a scalable system that allows as many ceiling panels 84 can be added to the frame structure 18 of the air containment system 16 as the frame structure itself can allow.

To organize wires and cables used associated with the air containment system 16 and the equipment racks 14 deployed within the air containment system, the cantilever assembly 22 can be used to support cable trays designed to support such cables and wires. The state of the art of cable tray design adequately provides for support and routing of cables, but consistently fails to address the placement, organization or means of support of junction boxes, receptacles, or other accessories that are required at the terminus of cables carried by the cable tray. The organization and placement of these related parts are generally left to the ingenuity of the practitioners who install cable trays and the related parts, and results in inconsistent and generally inefficient methods that consume considerable time and require the use of intermediate hardware. Embodiments of cable trays disclosed herein provide a cable tray that specifically permits the attachment and direct support of "trade size" electrical boxes, communications patch bays, and other commoditized electrical and communications trade parts and assemblies with only common fasteners. The cable tray can be used on most common types of cable assemblies run in cable trays, especially armored cable, and operates exceptionally well adapted to common installation practices.

Figure 14A:
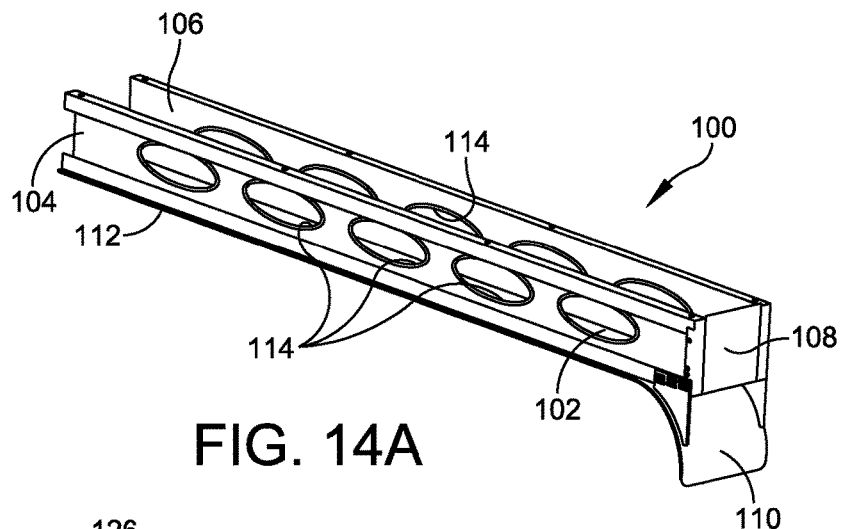
FIG. 14A is a perspective view of a cable tray of an embodiment of the present disclosure.
Figure 14B:
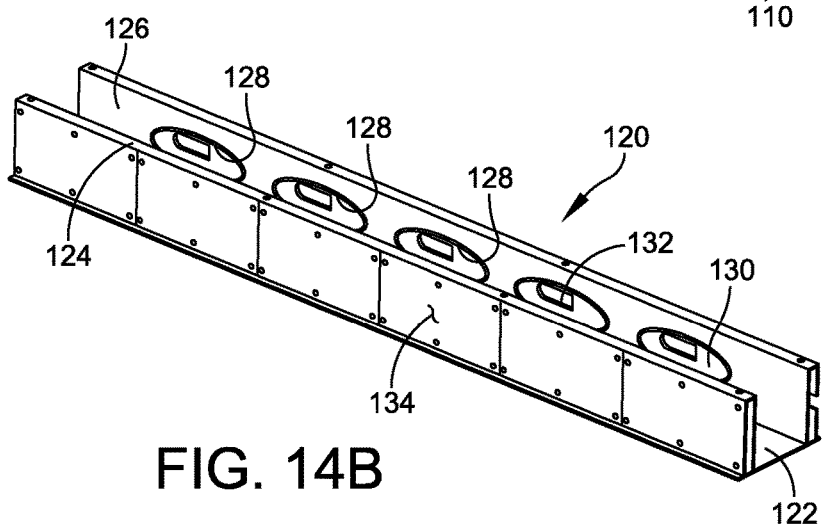
FIG. 14B is a perspective view of a cable tray of another embodiment of the present disclosure.
Figure 14C:
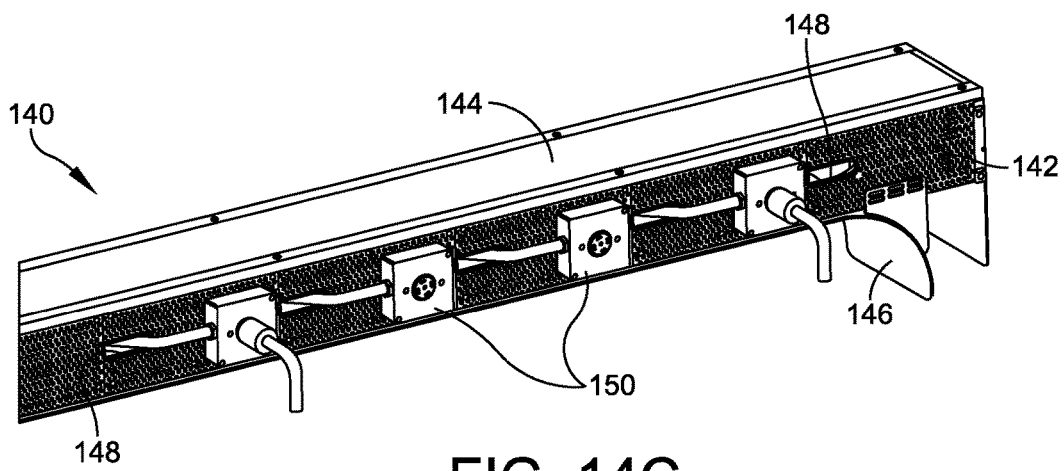
FIG. 14C is a perspective view of a cable tray of another embodiment of the present disclosure.

Referring to FIGS. 14A-14C, three embodiments of a cable tray are shown and described herein. FIG. 14A illustrates a cable tray, generally indicated at 100, which can be fabricated from solid or perforated sheet metal, plastic or composite material, or a combination of these materials. The cable tray 100 is designed to be used with the cantilever assembly 22, or other suitable structures associated with the frame structure 18 of the air containment system 16, and can include guides and supports for cables and wires, while changing elevations. As shown, the cable tray 100 includes a bottom wall or base plate 102 and two side walls 104, 106 secured to the bottom wall along long edges of the bottom wall. The cable tray 100 further can include an optional cover (not shown) to enclose the contents supported by the cable tray and protect the contents from dust and/or mechanical damage. An optional end cap 108 also can be provided to enclose an end of the cable tray 100. Another end cap can be provided at the opposite end of the cable tray 100.

The bottom wall 102 can be configured with curved ends to accommodate elevation changes or with flat ends. The cable tray 100 shown in FIG. 14A has a curved end 110 and a flat end 112. The side walls 104 106 are secured to the bottom wall 102 by screws, welding, or other means. As shown, the side walls 104, 106 have oval openings, each indicated at 114, formed therein at intervals along the lengths of the side walls to allow cables run through the central channel of the cable tray 100 to enter a cavity defined between the two side walls. The side walls 104, 106 are designed to receive cable tray side cover plates, which are constructed from solid or perforated sheet metal, plastic or composite material onto which common trade size junction boxes or receptacle boxes may be mounted.

Similarly, FIG. 14B illustrates a cable tray, generally indicated at 120, having a bottom wall 122 and two side walls 124, 126. As shown, the bottom wall 122 has flat ends, and one side wall, e.g., side wall 126, is provided with oval openings, each indicated at 128, formed therein at intervals along the length of the side wall to allow cables run through the central channel of the cable tray to enter the cavity defined between the two side walls. A cover plate 130 can be provided on the side wall (side wall 126) to mount components on the side wall, the cover plate being provided with smaller openings 132 to allow cables to enter into the cable tray 120. The other side wall, e.g., side wall 124, is designed to receive a cover plate 134, which is constructed from solid or perforated sheet metal, plastic or composite material, and designed to mount components on the side wall.

FIG. 14C illustrates a cable tray, generally indicated at 140, having a bottom wall (not designated), two side walls (side wall 142 being designated), and a cover 144 to enclose the contents supported by the cable tray and protect the contents from dust and/or mechanical damage. One end of the bottom wall is configured with a curved end to accommodate elevation changes. As shown, the side wall 142 has several slots, each indicated at 148, formed therein at intervals along the lengths of the side wall to allow cables run through the central channel of the cable tray 140 to enter a cavity defined between the two side walls. The side walls are constructed from perforated sheet metal, plastic or composite material onto which common trade size junction boxes or receptacle boxes, each indicated at 150, may be mounted. As shown, the cables that exit the central channel of the cable tray 140 are permitted to enter the trade size junction boxes or receptacle boxes 150 from a rear or from a side by the slots 148 in the cable tray side walls and/or cover plates.

The cable trays 100, 120, 140 of embodiments of the present disclosure are intended for use with metal-clad (type MC) or other armored cables or cable assemblies, tray cables bearing a TC (tray cable) designation, and other cables that may be deemed suitable for branch circuit use by rack mounted equipment. The cable trays are suitable for network cables, and other communication cables running between equipment racks 14 in the air containment system 16, or equipment racks in the air containment system and other termination points within the data center. The cable trays are designed to be installed on the cantilever assembly described herein, and can be sized to suit the intended use.

The cable trays of embodiments of the present disclosure are specifically intended to be constructed of sheet metal, plastic, or other materials that may be perforated or non-perforated, but have the general characteristic of not requiring drilling to assemble the tray(s) or connect sub-assemblies, components, or parts chosen by others and furnished from third parties. Such third party parts are inclusive of trade size electrical boxes, clips, hangers, or other attachments either used in the assembly and placement of the tray(s), or the development and termination of branch circuits.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. An air duct system configured to be used with an air containment system that spans an aisle defined by rows of racks, the air duct system comprising:
   a plurality of ceiling panels supported by the air containment system, each ceiling panel of the plurality of ceiling panels spanning the aisle;
   a plurality of spaced apart support curbs mounted on the ceiling panels, the plurality of support curbs being configured to support a duct positioned on the support curbs; and
   a plurality of panels secured to the support curbs to create a plenum underneath the duct, wherein the plenum extends along the plurality of support curbs,
   wherein the plenum and the duct extend longitudinally along a length of the aisle above the aisle, the plenum being configured to enable airflow between the duct and the aisle,
   wherein each support curb is a curved structure and is positioned to straddle two adjacent ceiling panels; and
   wherein each ceiling panel includes at least one opening to enable air to flow between the plenum and the aisle.

2. The air duct system of claim 1, wherein the plenum enables the duct to selectively deliver cool air to the aisle or exhaust hot air from the aisle.

3. The air duct system of claim 1, wherein each ceiling panel is rectangular in construction and configured to extend across a top of a frame structure of the air containment system.

4. The air duct system of claim 1, wherein each support curb includes a support surface that is curved to receive a profile of the duct supported by the support curbs.

5. The air duct system of claim 4, wherein the plurality of support curbs includes a first series of support curbs positioned on the ceiling panels along one side of the ceiling panels and a second series of support curbs positioned on the ceiling panels along an opposite side of the ceiling panels.

6. The air duct system of claim 5, wherein the first and second series of support curbs are configured to complement one another to create a cradle that receives the duct.

7. The air duct system of claim 1, wherein the plurality of panels includes blanking panels secured to the plurality of ceiling panels and the plurality of support curbs, the blanking panels being configured to enclose sides of the plenum.

8. The air duct system of claim 7, wherein the plurality of panels further include end caps secured to the ceiling panels and the support curbs, the end caps being configured to enclose ends of the plenum.

9. A kit for an air duct system configured to be used with an air containment system that spans an aisle defined by rows of racks, the kit comprising:
   a plurality of ceiling panels, each ceiling panel of the plurality of ceiling panels being configured to span the aisle;
   a plurality of spaced apart support curbs, each curb of the plurality of support curbs being configured to be mounted on the ceiling panels and to support a duct positioned on the support curbs; and
   a plurality of panels, each panel of the plurality of panels being configured to be secured to the support curbs of the plurality of support curbs to create a plenum underneath the duct, wherein the plenum extends along the plurality of support curbs when the duct is positioned on the support curbs,
   wherein the plenum enables the duct to selectively deliver cool air to the aisle or exhaust hot air from the aisle, and
   wherein, when assembled, the plenum and the duct extend longitudinally along a length of the aisle above the aisle, the plenum being configured to enable airflow between the duct and the aisle,
   each support curb is a curved structure and is positioned to straddle two adjacent ceiling panels; and
   wherein each ceiling panel includes at least one opening to enable air to flow between the plenum and the aisle.

10. The kit of claim 9, wherein each ceiling panel is rectangular in construction and configured to extend across a top of a frame structure of the air containment system.

11. The kit of claim 9, wherein each support curb includes a support surface that is curved to receive the profile of the duct supported by the support curbs.

12. The kit of claim 11, wherein a series of support curbs are positioned on the ceiling panels along one side of the ceiling panels and another series of support curbs positioned on the ceiling panels along an opposite side of the ceiling panels.

13. The kit of claim 12, wherein the two series of support curbs are configured to complement one another to create a cradle that receives the duct.

14. The kit of claim 9, wherein the plurality of panels include blanking panels secured to the ceiling panels and the support curbs, the blanking panels being configured to enclose sides of the plenum.

15. The kit of claim 14, wherein the plurality of panels further include end caps secured to the ceiling panels and the support curbs, the end caps being configured to enclose ends of the plenum.

* * * * *